(12) United States Patent
Hautala

(10) Patent No.: US 8,313,663 B2
(45) Date of Patent: Nov. 20, 2012

(54) SURFACE PROFILE ADJUSTMENT USING GAS CLUSTER ION BEAM PROCESSING

(75) Inventor: John J. Hautala, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 975 days.

(21) Appl. No.: 12/237,063

(22) Filed: Sep. 24, 2008

(65) Prior Publication Data

US 2010/0072173 A1    Mar. 25, 2010

(51) Int. Cl.
*B44C 1/22* (2006.01)
*C03C 15/00* (2006.01)
*C03C 25/68* (2006.01)
*C23F 1/00* (2006.01)

(52) U.S. Cl. ............... 216/58; 216/63; 216/66
(58) Field of Classification Search .......... None
See application file for complete search history.

(56) References Cited

U.S. PATENT DOCUMENTS

| | | | |
|---|---|---|---|
| 4,361,762 A | 11/1982 | Douglas | |
| 4,740,267 A | 4/1988 | Knauer et al. | |
| 4,886,971 A | 12/1989 | Matsumura et al. | |
| 4,916,311 A | 4/1990 | Fuzishita et al. | |
| 6,110,392 A * | 8/2000 | Kerber et al. | 216/3 |
| 6,218,207 B1 | 4/2001 | Itoh et al. | |
| 6,797,339 B2 | 9/2004 | Akizuki et al. | |
| 7,060,989 B2 | 6/2006 | Swenson et al. | |
| 7,173,252 B2 | 2/2007 | Mack | |
| 7,259,036 B2 | 8/2007 | Borland et al. | |
| 2002/0130275 A1 | 9/2002 | Mack et al. | |
| 2004/0060900 A1* | 4/2004 | Waldhauer et al. | 216/2 |
| 2007/0215463 A1* | 9/2007 | Parkhe | 204/298.12 |

FOREIGN PATENT DOCUMENTS

JP    62296357 A    12/1987

OTHER PUBLICATIONS

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).
Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.
Yamada, I. et al., Surface modification with gas cluster ion beams, Nuclear Instruments & Methods in Physics Research, vol. B79, Nov. 2, 1992, pp. 223-226, XP001031961, ISSN: 0168-583X.
Borland, et al., Doping and Deposition, Solid State Technology, May 2004, pp. 114-117.

* cited by examiner

*Primary Examiner* — Duy Deo
(74) *Attorney, Agent, or Firm* — Wood, Herron & Evans, LLP

(57) ABSTRACT

A method of treating a workpiece is described. The method comprises selectively forming a sacrificial material on one or more regions of a substrate or a layer on the substrate using a gas cluster ion beam (GCIB), and adjusting a surface profile of a surface on the substrate or the layer on the substrate by performing an etching process following the selective formation.

20 Claims, 11 Drawing Sheets

SURFACE PROFILE ADJUSTMENT USING GAS CLUSTER ION BEAM PROCESSING

BACKGROUND OF THE INVENTION

1. Field of Invention

The invention relates to a method for performing corrective processing of a workpiece using gas cluster ion beam (GCIB) processing, and more particularly, to adjusting the surface profile of the workpiece.

2. Description of Related Art

Gas-cluster ion beams (GCIB's) are used for many applications, including etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electron charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the workpiece. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, and nitrous oxide, and mixtures of these gases.

One emerging application for GCIB processing of workpieces includes corrective spatial processing. Therein, a workpiece property, such as a film thickness, is spatially adjusted across the workpiece. By varying the GCIB dose between two separate locations on the workpiece, the film thickness, or other workpiece property, may be adjusted relative to each location. For example, as illustrated in FIG. 1, an upper surface 14 of a thin film 12 on substrate 10 may be planarized by selectively removing material from upper surface 14 using a GCIB. In the exploded view 20 of upper surface 14, an initial surface profile 16 may be flattened to produce a planar final surface profile 22 by selectively removing or etching material 18. The amount of material 18 to be removed from the upper surface 14 of thin film 12 directly affects the required dose required at each location on substrate 10 and, hence, the total amount of time needed for GCIB processing. Therefore, as the amount of material 18 increases, the throughput will decrease, and the processing time may become expensive or even prohibitive.

SUMMARY OF THE INVENTION

The invention relates to a method for performing corrective processing of a workpiece. In particular, the invention relates to a method for adjusting a surface profile of a workpiece using gas cluster ion beam (GCIB) processing. In one embodiment, the invention relates to a method of planarizing a workpiece using gas cluster ion beam (GCIB) processing.

According to one embodiment, a method of performing corrective processing of a workpiece is described. The method comprises selectively forming a sacrificial material on one or more regions of a surface on a workpiece using a gas cluster ion beam (GCIB), and adjusting a surface profile of a surface on the workpiece by performing an etching process following the selective formation. The etching process etches both the sacrificial material and the workpiece material.

According to another embodiment, the method comprises: acquiring metrology data for a workpiece; computing correction data for the workpiece using the metrology data; applying the correction data to the workpiece using a gas cluster ion beam (GCIB) to selectively form a sacrificial material on one or more regions of a surface on the workpiece; and performing an etching process to remove the sacrificial material, and at least a portion of the surface of the workpiece.

According to yet another embodiment, a processing system for performing corrective processing of a surface on a workpiece is described. The processing system comprises: a metrology system configured to acquire metrology data for a workpiece; a multi-process control system configured to compute correction data for the workpiece using the metrology data; a gas cluster ion beam (GCIB) processing system configured to apply the correction data to the workpiece to selectively deposit a sacrificial material on one or more regions of a surface on the workpiece; an etching system configured to adjust a surface profile of the surface of the workpiece by performing an etching process to remove the sacrificial material and at least a portion of the surface of the workpiece; and a workpiece handling system coupled to the GCIB processing system, and the etching system, and configured to transport the workpiece to and from the GCIB processing system and the etching system according to instructions from the control system.

DETAILED DESCRIPTION OF SEVERAL EMBODIMENTS

Figure 1:
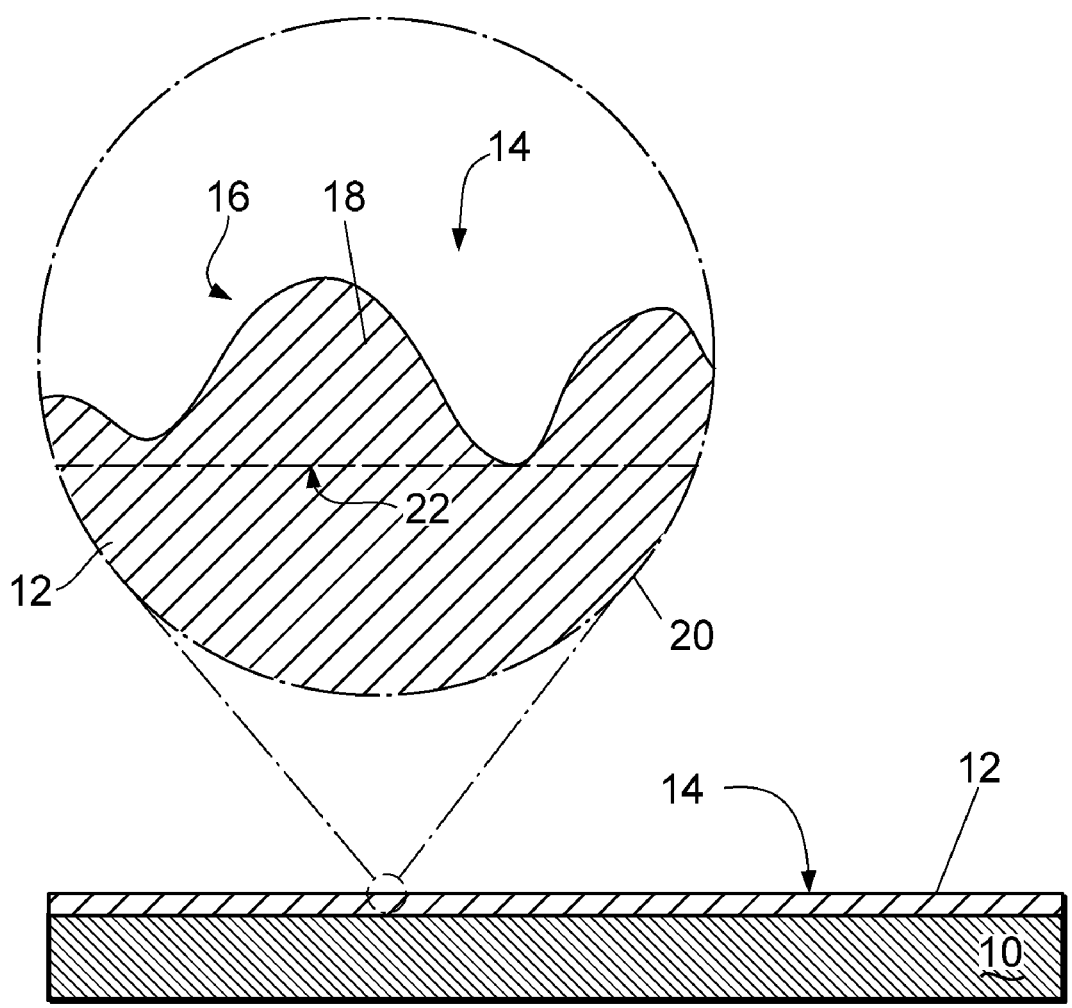
FIG. 1 illustrates a method of performing corrective processing on a workpiece according to the prior art.

A method and system for performing corrective processing on a workpiece using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Workpiece" as used herein generically refers to the object being processed in accordance with the invention. The workpiece may include any material portion or structure of a device, particularly a semiconductor or other electronics device, and may, for example, be a base substrate structure, such as a semiconductor wafer or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of workpieces, but this is for illustrative purposes only and not limitation.

As described above, there is a general need for performing corrective processing of a workpiece using a GCIB. In particular, there is a need to adjust a surface profile of a surface on a workpiece. For example, there may be a need to planarize the upper surface of a workpiece. However, as described above, the GCIB processing time may become excessive and even prohibitive when attempting to remove material using only GCIB processing.

Figure 2A:
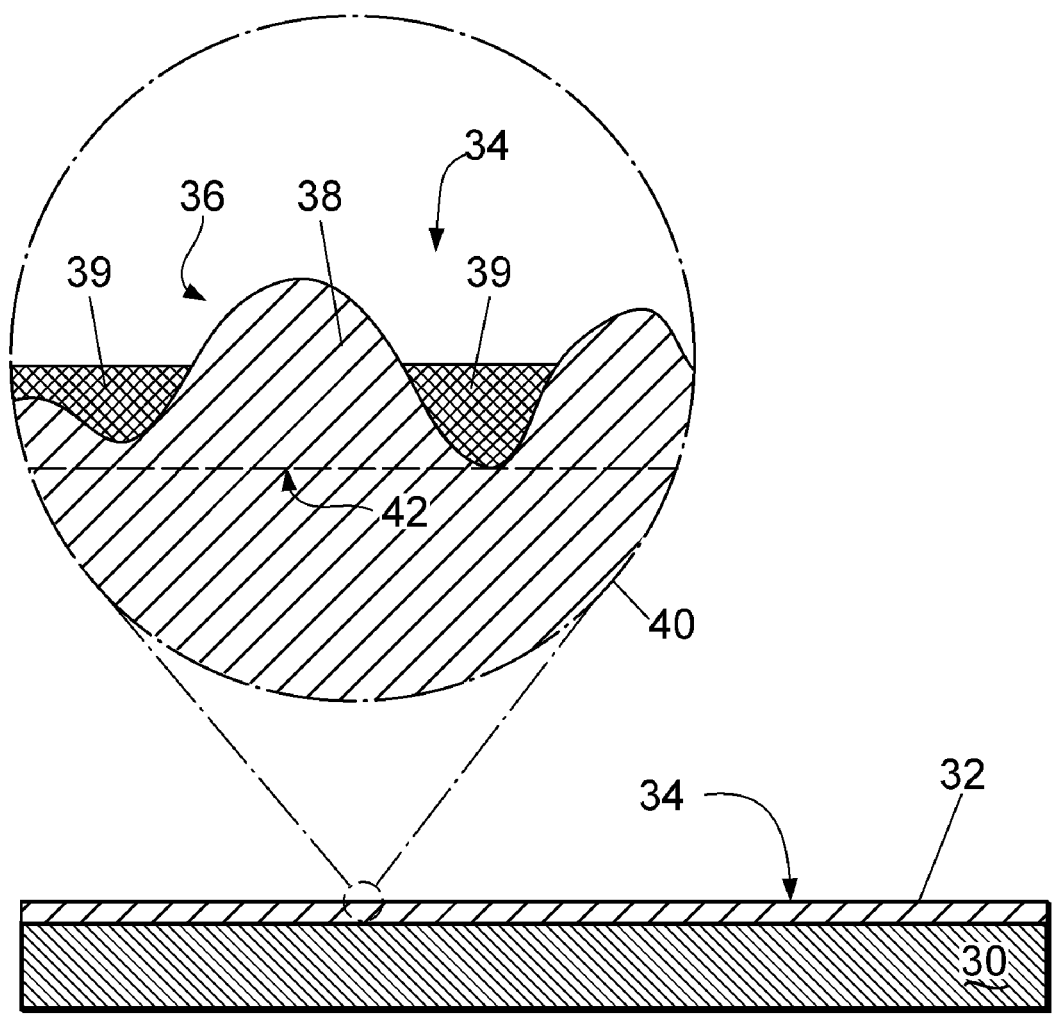
FIG. 2A illustrates a method of performing corrective processing on a workpiece according to an embodiment.
Figure 2B:
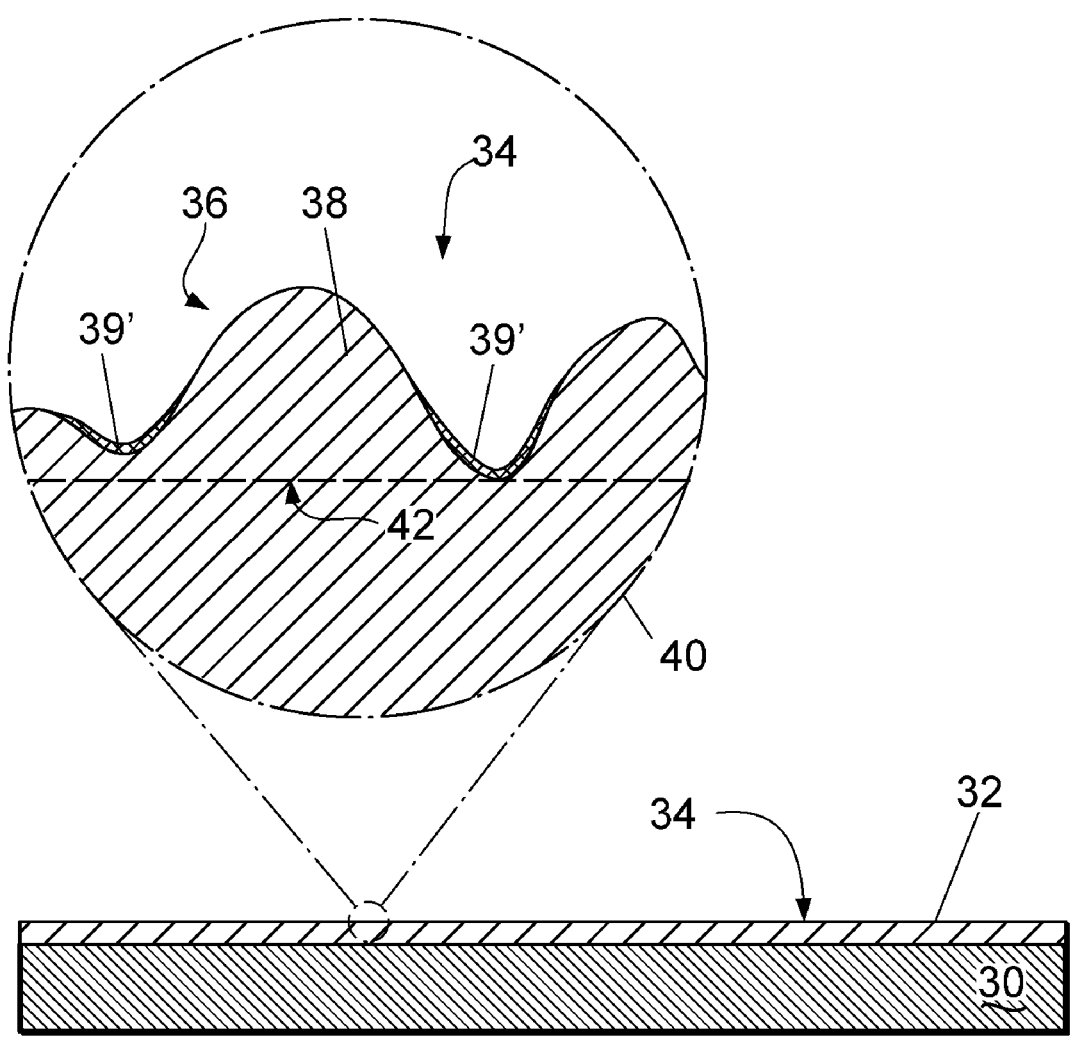
FIG. 2B illustrates a method of performing corrective processing on a workpiece according to another embodiment.

Therefore, according to one embodiment, a method of performing corrective processing on a workpiece is described. In this example, the workpiece is a thin film on a substrate. As illustrated in FIGS. 2A and 2B, an upper surface 34 of a thin film 32 on a substrate 30 may be planarized by selectively forming sacrificial material 39, 39' onto upper surface 34 using a GCIB, followed by performing an etching process. The selective formation of sacrificial material may be achieved by selectively depositing sacrificial material 39 (FIG. 2A), or selectively growing sacrificial material 39' (FIG. 2B). For example, in the exploded view 40 of upper surface 34, an initial surface profile 36 may be flattened to produce a planar surface profile 42 by selectively forming the sacrificial material 39, 39' in low regions or "valleys" on thin film 32. Thereafter, an etching process that removes thin film 32 at a greater rate than the sacrificial material 39, 39' may be performed to remove both the sacrificial material 39, 39' from thin film 32 and the relatively higher regions or "peaks" of thin film 32 on substrate 30. Since the etch rate of the sacrificial material 39, 39' is relatively lower, the sacrificial material 39, 39' temporarily protects the low regions or "valleys" of thin film 32 while the relatively higher regions or "peaks" are removed.

The amount of sacrificial material 39, 39' needed to achieve the planar surface profile 42 depends on the difference between the etch rates of the sacrificial material 39, 39' and the thin film 32. As illustrated in FIGS. 2A and 2B, the amount of sacrificial material 39, 39' to be selectively deposited or grown by the GCIB may be less and even substantially less than the amount of material needed to be removed from the thin film 32 on substrate 30. As a result, the GCIB processing time may be substantially reduced.

As illustrated in FIGS. 2A and 2B, corrective processing is performed on upper surface 34 of thin film 32 on substrate 30. Alternatively, corrective processing may be performed on an upper surface of substrate 30. Alternatively yet, corrective processing may be performed on a substrate having one or more thin films, or one or more structures, or a combination thereof, wherein each thin film and/or structure may or may not comprise different material properties. Thus, as described above, corrective processing may be performed on any workpiece where an adjustment to the surface profile is desired.

Figure 3A:
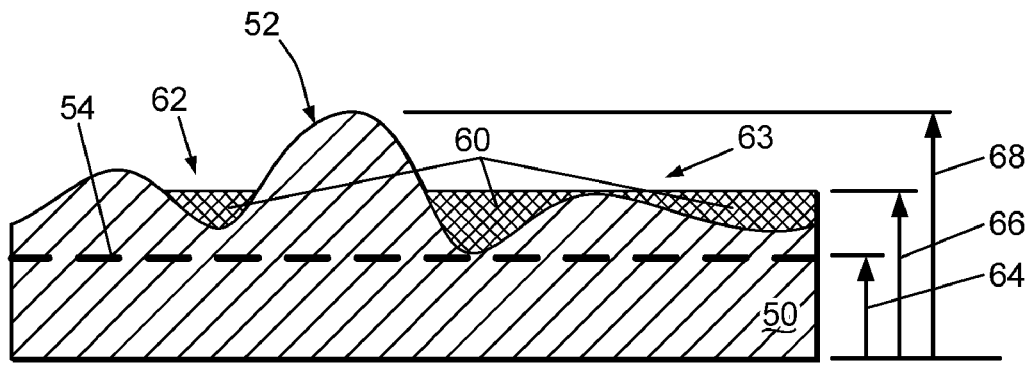
FIGS. 3A through 3C illustrate a method of performing corrective processing on a workpiece according to other embodiments.
Figure 3B:
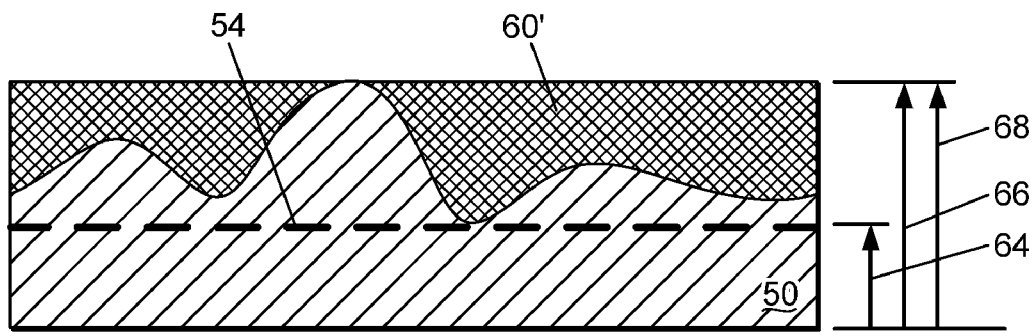
Figure 3C:
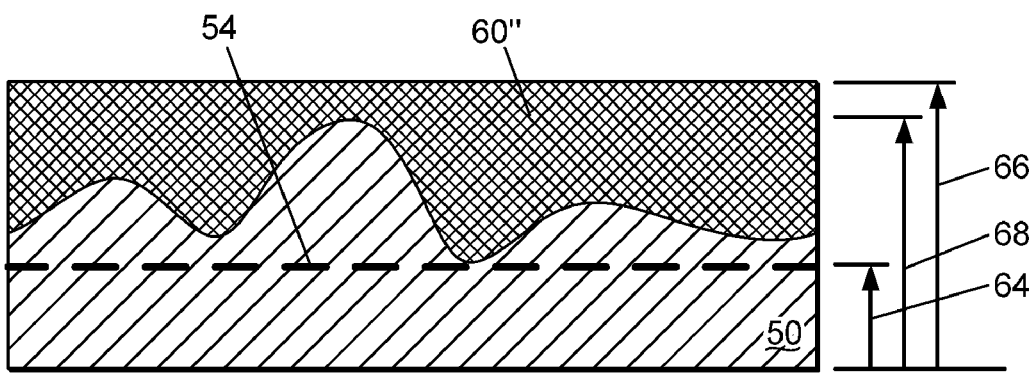

Referring now to FIGS. 3A through 3C, several methods of performing corrective processing on a workpiece are described according to other embodiments. In these examples, the workpiece is a semiconductor substrate. As shown in FIG. 3A, a substrate 50 comprises an initial surface profile 52, wherein through corrective processing of substrate 50 a target surface profile 54 may be achieved. In this example, a planarized surface profile is depicted as the target, but the invention is not so limited. The initial surface profile 52 may be characterized by a minimum surface height 64 and a maximum surface height 68. As described above, a sacrificial material 60 may be selectively formed on one or more regions of substrate 50 using a GCIB. For example, the one or more regions on substrate 50 may include a first region 62 and a second region 63.

Thereafter, an etching process is performed to remove the sacrificial material 60 and achieve the target surface profile 54. The etching process may include a dry etching process, or a wet etching process, or both. The dry etching process may include a dry non-plasma etching process, or a dry plasma etching process, or both. The wet etching process may include immersion of one or more substrates in a liquid phase etching solution.

The amount of sacrificial material 60 selectively formed on substrate 50 may be characterized by a sacrificial material height 66. Although the sacrificial material height 66 for sacrificial material 60 in the first region and the second region 63 are shown to be the same, the sacrificial material height may vary from the first region 62 to the second region 63.

As illustrated in FIG. 3A, when the etching process is selected to etch the substrate 50 at a greater rate than the sacrificial material 60, the sacrificial material height 66 may be chosen to be intermediate to the minimum surface height 64 and the maximum surface height 68 of the initial surface profile 52 of substrate 50. For example, the greater the difference in etch rates between the substrate 50 and the sacrificial material 60, the lesser the amount of sacrificial material 60 necessary to achieve the target surface profile 54. Additionally, the lesser the difference in etch rates between the substrate 50 and the sacrificial material 60, the greater the amount of sacrificial material 60 necessary to achieve the target surface profile 54.

As illustrated in FIGS. 3B and 3C, when the etch rate of substrate 50 and sacrificial material 60', 60" are substantially the same, the sacrificial material height may be selected to be about the same as the maximum surface height of the initial surface profile (FIG. 3B), or greater (FIG. 3C).

Therefore, in certain embodiments, the etch rate of the workpiece material is different than, for example greater than, the etch rate of the sacrificial material, while in other embodiments, the etch rates are approximately equal. Depending on the relative etch rates, the sacrificial material may be selectively formed to a height that is (1) intermediate the minimum and maximum surface heights of the initial surface profile, (2) equal to the maximum surface height of the initial surface profile, or (3) greater than the maximum surface height of the initial surface profile. According to one embodiment, the etching of the sacrificial material and workpiece material may be such that the final surface profile has a maximum surface height and a minimum surface height in which the difference therebetween is less than the corresponding difference in the initial surface profile. In other words, the surface profile may be adjusted to decrease the disparity between the peaks and valleys. In another embodiment, the etching is effective to planarize the surface such that the final surface profile is essentially flat. To that end, the workpiece surface may be etched down to the minimum surface height of the initial surface profile or to some depth below the minimum surface height.

Figure 4:
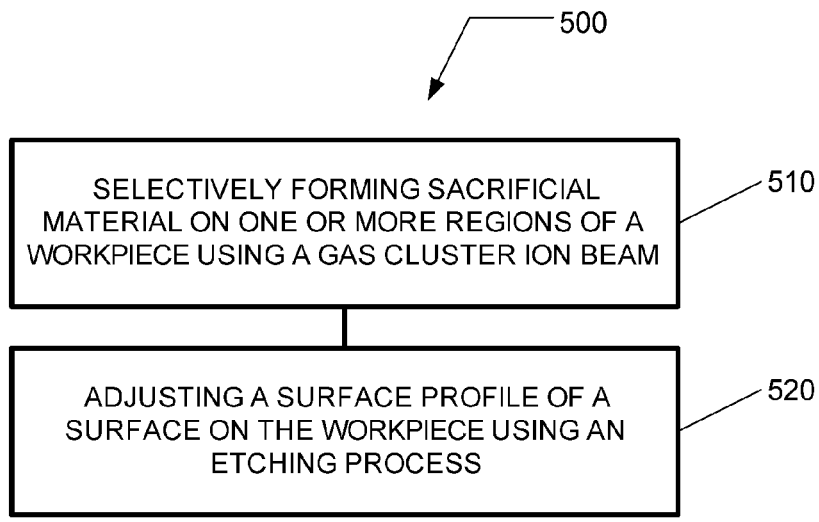
FIG. 4 provides a flow chart for a method of performing corrective processing on a workpiece according to an embodiment.

Referring now to FIG. 4, a method of performing corrective processing of a workpiece is described according to an embodiment. The method comprises a flow chart 500 beginning in 510 with selectively forming a sacrificial material on one or more regions of a workpiece using a GCIB. In 520, a surface profile of a surface on the workpiece is adjusted by performing an etching process following the selective formation of the sacrificial material.

According to an example, the adjustment of the surface profile of a workpiece may include the planarization of a silicon substrate, such as a single crystal silicon substrate, using corrective processing. The sacrificial material may include a silicon-containing material, such as silicon oxide ($SiO_x$), silicon nitride ($SiN_x$), silicon carbide ($SiC_x$), silicon oxynitride ($SiO_xN_y$), or silicon carbonitride ($SiC_xN_y$), or any combination of two or more thereof. For example, the sacrificial material may include silicon oxide, silicon nitride, or silicon carbide. Additionally, the sacrificial material may include a carbon-containing material, such as amorphous carbon or diamond-like carbon. Additionally yet, the sacrificial material may include a germanium-containing material. Furthermore, the sacrificial material may include a boron-containing material, such as BN. The sacrificial material may include a material that etches at a different rate than the workpiece material being corrected when subjected to the etching process.

Selective formation may include selective deposition of the sacrificial material, wherein all of the atomic constituents of the sacrificial material are introduced in the GCIB. For example, when depositing $SiN_x$ or $SiC_x$, the workpiece is irradiated by a GCIB containing both silicon and nitrogen, or silicon and carbon, respectively. Alternatively, selective formation may include selective growth of the sacrificial material, wherein only a fraction of the atomic constituents of the sacrificial material are introduced in the GCIB and the remaining fraction is provided by the workpiece upon which the sacrificial material is grown. For example, when growing $SiO_x$ on a workpiece, the workpiece may comprise a silicon surface, which is irradiated by a GCIB containing oxygen.

When generating the GCIB, a pressurized gas is expanded into a reduced pressure environment to form gas-clusters, the gas-clusters are ionized, and the ionized gas-clusters are accelerated and optionally filtered. During selective deposition of $SiN_x$, $SiC_x$, or $SiC_xN_y$, the pressurized gas may contain a silicon-containing specie and a carbon-containing specie and/or a nitrogen-containing specie. For example, the silicon-containing specie may include silane ($SiH_4$), disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), silicon tetrafluoride ($SiF_4$), or a combination of two or more thereof. Additionally, for example, the carbon-containing specie may include a hydrocarbon gas having the formula $C_xH_y$, wherein x and y are integers greater than or equal to unity, a fluorocarbon gas having the formula $C_xF_y$, wherein x and y are integers greater than or equal to unity, a hydrofluorocarbon gas having the formula $C_xH_yF_z$, wherein x, y and z are integers greater than or equal to unity, CO, or $CO_2$, or any combination of two or more thereof. Furthermore, for example, the nitrogen-containing specie may include $N_2$, $NH_3$, $NF_3$, NO, $N_2O$, or $NO_2$, or any combination of two or more thereof. Additional details for film deposition using a GCIB are provided in U.S. application Ser. No. 11/864,961, entitled "METHOD FOR DEPOSITING FILMS USING GAS CLUSTER ION BEAM PROCESSING"; the content of which is incorporated herein by reference in its entirety.

Alternatively, the pressurized gas may comprise a compound having silicon (Si) and carbon (C), or a compound having Si and nitrogen (N). The compound contains Si and C in the same molecule, or Si and N in the same molecule. Further, the compound may possess a Si—C bond, or a Si—N bond. For example, the pressurized gas may comprise an alkyl silane, an alkane silane, an alkene silane, or an alkyne silane, or any combination of two or more thereof. Additionally, for example, the pressurized gas may include methylsilane ($H_3C$—$SiH_3$), dimethylsilane ($H_3C$—$SiH_2$—$CH_3$), trimethylsilane (($CH_3)_3$—SiH), or tetramethylsilane (($CH_3)_4$—Si), or any combination of two or more thereof. Additional details for film deposition using a GCIB are provided in U.S. application Ser. No. 12/049,583, entitled "METHOD AND SYSTEM FOR DEPOSITING SILICON CARBIDE FILM USING A GAS CLUSTER ION BEAM"; the content of which is incorporated herein by reference in its entirety.

During selective growth of $SiO_x$ or $SiN_x$, the pressurized gas may contain an oxygen-containing specie, such as $O_2$, NO, $N_2O$, or $NO_2$, or any combination of two or more thereof. Additional details for film growth using a GCIB are provided in U.S. application Ser. No. 12/144,968, entitled "METHOD AND SYSTEM FOR GROWING A THIN FILM USING A GAS CLUSTER ION BEAM"; the content of which is incorporated herein by reference in its entirety.

In order to adjust the relative amount of sacrificial material formed on the workpiece, the GCIB acceleration potential, or the GCIB dose, or any combination thereof may be varied from one region to another region in the one or more regions on the workpiece. Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface per unit area (i.e., the number of clusters per unit area per unit time) may be held constant while the time is varied to change the beam dose. Additionally, other GCIB properties may be varied to adjust the sacrificial material thickness and/or the surface profile of the sacrificial material including, but not limited to, gas flow rate, stagnation pressure, cluster size, or gas nozzle design (such as nozzle throat diameter, nozzle length, and/or nozzle divergent section half-angle). Furthermore, other material properties may be varied by adjusting the GCIB properties including, but not limited to, density, quality, etc.

Following the selective formation of the sacrificial material on the one or more regions of the workpiece, the initial surface profile is adjusted towards the target surface profile by performing an etching process to remove exposed regions of the workpiece while removing the sacrificial material. Desirably, when planarizing the workpiece, the sacrificial material is removed at a slower rate than the workpiece material.

The etching process may include a wet etching process, wherein one or more workpieces are immersed in a liquid phase etching solution following selective formation of the sacrificial material. For example, the liquid phase etching solution may comprise nitric acid ($HNO_3$), hydrofluoric acid (HF), sulfuric acid ($H_2SO_4$), phosphoric acid ($H_3PO_4$), or a mixture of two or more thereof. The liquid phase etching solution may further include one or more additives, such as, for example, a pH modifier to control the etch rate and/or etch selectivity, a surfactant to improve the surface wetting, and/or an organic solvent to control etch selectivity. The pH modifier may include $NH_4OH$, $NH_4F$, HCl, $HNO_3$, or $H_2SO_4$. Additionally, the liquid phase etching solution may further include water, or a buffering agent, such as ammonium fluoride ($NH_4F$), or a mixture thereof. The composition of the liquid phase etching solution, or the temperature of the solution, or both may be tailored to achieve a target etch selectivity between the sacrificial material and the workpiece material.

Alternatively, the etching process may include a dry etching process, wherein one or more workpieces are exposed to a dry non-plasma or dry plasma etching process. For example, the etching process may include a dry plasma etching process, wherein a process gas is introduced to a process chamber maintained under a reduced-pressure atmosphere and plasma is formed by heating free electrons in the process gas to cause ionizing collisions. The workpiece is exposed to the mixture of chemically reactive and electrically charged species to cause etching of the workpiece materials. When etching silicon (single crystal or polycrystalline silicon), the process gas may comprise a halogen-containing specie, such as HCl, HBr, $Cl_2$, $Br_2$, $F_2$, $NF_3$, $SF_6$, etc. The process gas may further comprise an inert gas, such as a noble gas, an oxygen-containing gas, a fluorocarbon gas, a hydrocarbon gas, or a fluorohydrocarbon gas, or any combination of two or more thereof. The composition of the etching process, the temperature of the workpiece, the pressure of the reduced-pressure atmosphere, or the power coupled to the plasma, or any combination of two or more thereof may be tailored to achieve a target etch selectivity between the sacrificial material and the workpiece material.

Figure 5:
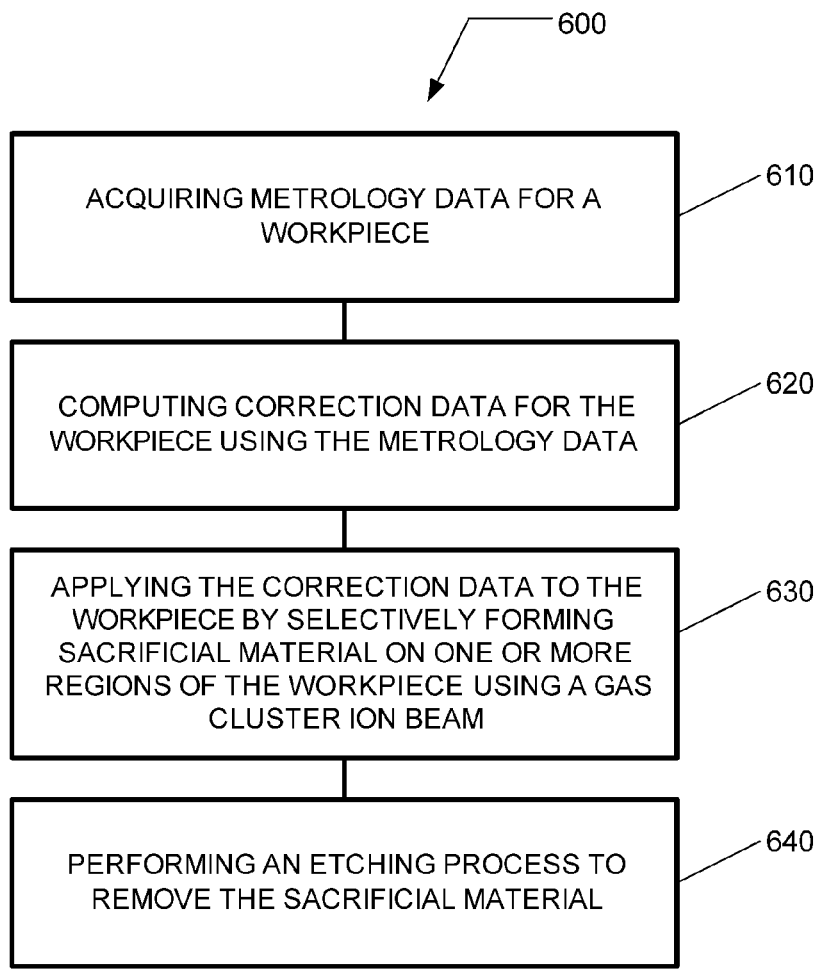
FIG. 5 provides a flow chart for a method of performing corrective processing on a workpiece according to another embodiment.

Referring now to FIG. 5, a method of performing corrective processing of a workpiece is described according to another embodiment. The method comprises a flow chart 600 beginning in 610 with acquiring metrology data for a workpiece. The metrology data can include parametric data, such as geometrical, mechanical, electrical and/or optical parameters associated with the upper layer or one or more devices formed in or on the upper layer of the workpiece. For example, metrology data includes, but is not limited to, any parameter measurable by the metrology systems described above. Additionally, for example, metrology data includes measurements for a film thickness, a film height, a surface roughness, a surface contamination, a feature depth, a trench depth, a via depth, a feature width, a trench width, a via width, a critical dimension (CD), an electrical resistance, or any combination of two or more thereof.

Figure 6:
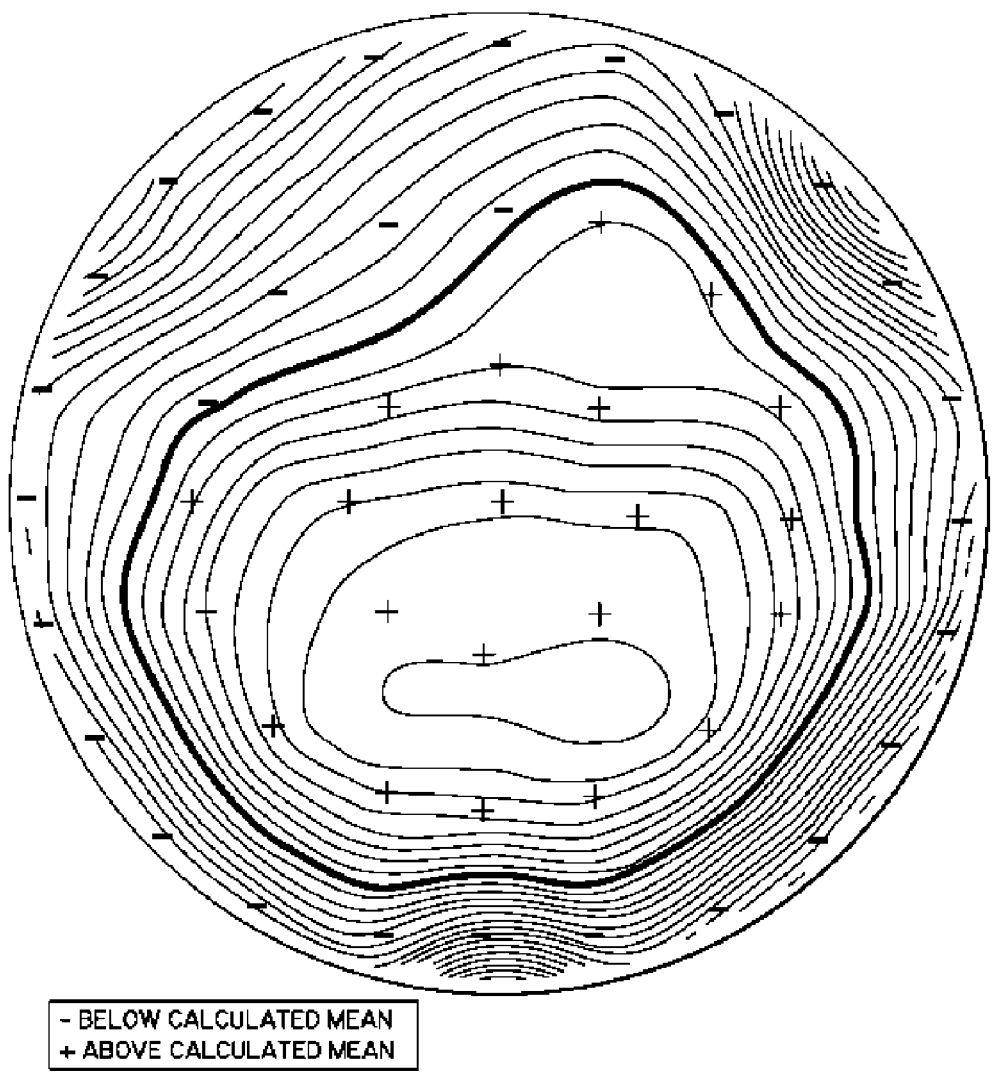
FIG. 6 illustrates correction data for a workpiece.

According to one example, FIG. 6 illustrates a film-thickness map of a semiconductor substrate with an upper layer comprising a thin film or layer as measured by a spectroscopic ellipsometry instrument, such as a commercially available model UV-1280SE thin film measurement instrument manufactured by KLA-Tencor Corporation. As illustrated in FIG. 6, the thickness of a thin film on a substrate structure is mapped as a function of position on the substrate structure.

For example, such a measurement of the initial thickness non-uniformity of an upper film layer on a substrate structure is characterized ex-situ of the GCIB processing system by spectroscopic ellipsometry or other suitable conventional techniques. Such techniques produce a point-by-point film thickness map that is reduced to thickness contours (or similar) as shown in FIG. 6. In an alternative embodiment, an in-situ uniformity-mapping instrument using spectroscopic ellipsometry or other suitable conventional film thickness mapping techniques is incorporated within the GCIB processing system (to be described later) for checking a profiling process. In either case, the non-uniformity measurements are stored as a series of thickness points with precise positions by a standard computer. As an example, a film measurement method such as spectroscopic ellipsometry is used to map the thickness of only the top film layer, independent of variations in substrate structure thickness, thickness of underlying films, or surface flatness.

As illustrated in FIG. 6, metrology data is measured at two or more locations on the workpiece. In another embodiment, this data is acquired and collected for a plurality of workpieces. The plurality of workpieces, for example, may include a cassette of semiconductor substrates having thin films thereon. The metrology data is measured at two or more locations on a workpiece and, for example, is acquired at a plurality of locations on the workpiece. Thereafter, the plurality of locations indicating the film-thickness on the workpiece is expanded from the measured sites to the unmeasured sites using a data fitting algorithm. For example, the data fitting algorithm includes interpolation (linear or nonlinear), extrapolation (linear or nonlinear), or a combination thereof. By fitting the metrology data, one or more mathematical representations of the metrology data are produced. An example of a data fitting algorithm is found in Matlab commercially available from The MathWorks, Inc. (3 Apple Hill Drive, Natick, Mass. 01760).

In other embodiments, when metrology data for a workpiece includes measurements for a film height, a surface roughness, etc., the data fitting process described above is also performed to obtain data points for the unmeasured sites on the workpiece. In an alternative embodiment, metrology data is obtained for the entire workpiece and the data fitting process is not performed.

In 620, correction data is computed for a workpiece using the metrology data for the workpiece. The correction data for a given workpiece comprises a process condition for modulation of the GCIB dose as a function of position on the workpiece in order to achieve a change between the parametric data, such as a surface profile of substrate or film thickness, associated with the incoming metrology data and the target parametric data, such as a desired final surface profile for substrate or film thickness, for the given workpiece. For example, the correction data for a given workpiece can comprise determining a process condition for using the GCIB to correct a non-uniformity of the parametric data for the given workpiece. Therein, a spatial map is provided for adjusting the process condition (e.g., GCIB dose) as a function of position on the workpiece in order to vary an amount of sacrificial material formed on the workpiece prior to the etching process. Alternatively, for example, the correction data for a given workpiece can comprise determining a process condition for using the GCIB to create a specifically intended non-uniformity of the parametric data for the given workpiece.

Using an established relationship between the desired change in parametric data and the GCIB dose and an established relationship between the GCIB dose and a GCIB process condition having a set of GCIB processing parameters, the correction data for each workpiece is determined. For example, a mathematical algorithm can be employed to take the parametric data associated with the incoming metrology data, compute a difference between the incoming parametric data and the target parametric data, invert the GCIB processing pattern (i.e., deposition pattern) and etching pattern taking into account the etch selectivity and/or uniformity in the etching process to fit this difference, and create a beam dose contour to achieve the GCIB processing pattern using the relationship between the change in parametric data and the GCIB dose. Thereafter, for example, GCIB processing parameters can be determined to affect the calculated beam dose contour using the relationship between the beam dose and the GCIB process condition. The GCIB processing parameters can include a beam dose, a beam area, a beam profile, a beam intensity, a beam scanning rate, or an exposure time (or beam dwell time), or any combination of two or more thereof.

In 630, the correction data is applied to the workpiece by selectively forming the sacrificial material on one or more regions of the workpiece using a gas cluster ion beam.

In 640, an etching process is performed to remove the sacrificial material. Therein, the parametric data of the workpiece is adjusted from the initial parametric data (e.g., initial surface profile of substrate or film thickness) to the target parametric data (e.g., final surface profile of substrate or film thickness).

Figure 7:
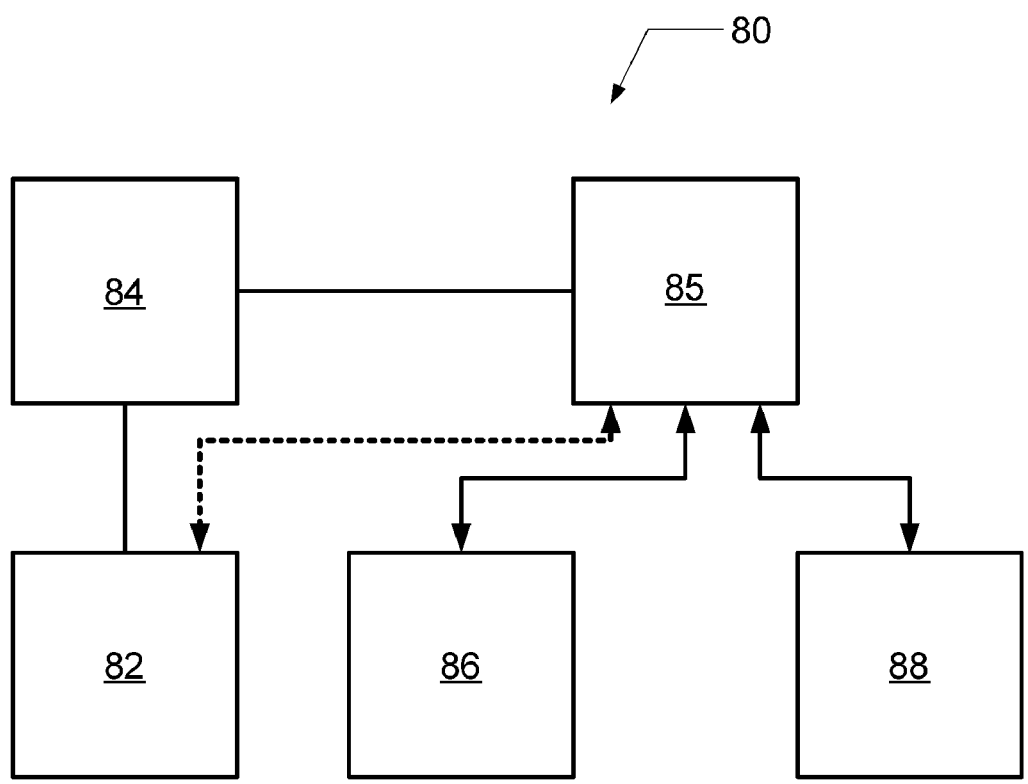
FIG. 7 is a schematic illustration of a corrective processing system according to an embodiment.

Referring now to FIG. 7, a processing system 80 is described for performing the method described in FIG. 5. The processing system 80 comprises a metrology system 82 configured to acquire metrology data for a workpiece, a multi-process control system 84 configured to compute correction data for the workpiece using the metrology data, a GCIB processing system 86 configured to apply the correction data to the workpiece to selectively deposit a sacrificial material on one or more regions of a surface on the workpiece, and an etching system 88 configured to adjust a surface profile of the surface of the workpiece by performing an etching process to remove the sacrificial material. Furthermore, the processing system 80 comprises a workpiece handling system 85 coupled to the GCIB processing system 86, and the etching system 88, and configured to transport the workpiece to and from the GCIB processing system 86 and the etching system 88 according to instructions from the multi-process control system 84.

The metrology system 82 may include an ex-situ metrology system or it may include an in-situ metrology system. In one embodiment, metrology system 82 is located ex-situ of the GCIB processing system 86, which means that the measurement equipment is located separate from the GCIB processing system 86. In an alternative embodiment, the metrology system 82 is located in-situ and is therefore contained within the GCIB processing system 86 to allow for in-vacuum measurements on the GCIB processing system 86. The metrology system 82 may be accessible to the workpiece handling system 85 (as indicated by the dashed line in FIG. 7), or it may not be accessible to the workpiece handling system 85.

Metrology system 82 comprises any variety of workpiece diagnostic systems including, but not limited to, optical diagnostic systems, X-ray fluorescence spectroscopy systems, four-point probing systems, transmission-electron microscope (TEM), atomic force microscope (AFM), scanning-electron microscope (SEM), etc. In another embodiment, the metrology system 82 comprises an optical digital profilometer (ODP), a scatterometer, an ellipsometer, a reflectometer, an interferometer, or any combination of two or more thereof.

For example, the metrology system 82 constitutes an optical scatterometry system. The scatterometry system includes a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a workpiece.

Once the metrology data is collected for the workpiece using the metrology system 82, the metrology data is provided to the multi-process control system 84 for computing correction data. Metrology data is communicated between the metrology system 82 and the multi-process control system 84 via a physical connection (e.g., a cable), or a wireless connection, a combination thereof, or any other desired transmission medium. In another embodiment, the metrology data is communicated via an intranet or internet connection. Alternatively, the metrology data is communicated between the metrology system 82 and the multi-process control system 84 via a computer readable medium.

Referring still to FIG. 7, the multi-process control system 84 is configured to receive the metrology data from the metrology system 82, compute correction data for the workpiece using the metrology data, and instruct the GCIB processing system 86 to apply completed correction data to the workpiece using a gas cluster ion beam (GCIB).

According to one embodiment, the multi-process control system 84 comprises a microprocessor, memory, and a digital I/O port capable of generating control voltages sufficient to communicate and activate inputs to the workpiece handling system 85, the GCIB processing system 86, and the etching system 88, as well as monitor outputs from the workpiece handling system 85, the GCIB processing system 86, and the etching system 88. Moreover, multi-process control system 84 is configured to exchange information with metrology system 82, the workpiece handling system 85, the GCIB processing system 86, and the etching system 88.

As an example, the multi-process control system 84 is implemented as a general purpose computer system that performs a portion or all of the microprocessor based processing steps of the invention in response to a processor executing one or more sequences of one or more instructions contained in a memory. Such instructions are read into the controller memory from another computer readable medium, such as a hard disk or a removable media drive. One or more processors in a multi-processing arrangement are employed as the controller microprocessor to execute the sequences of instructions contained in main memory. In alternative embodiments, hard-wired ASICS configured to perform the functionality of the workpiece handling system 85, the GCIB processing system, 86, and the etching system 88 are used in place of or in combination with software instructions. Thus, embodiments are not limited to any specific combination of hardware circuitry and software.

As an example, the multi-process control system 84 is used to configure any number of processing elements, as described above, and the multi-process control system 84 collects, provides, processes, stores, and displays data from the processing elements. The multi-process control system 84 includes a number of applications, as well as a number of controllers, for controlling one or more of the processing elements. For example, multi-process control system 84 includes a graphical user interface (GUI) component (not shown) that provides interfaces that enable a user to monitor and/or control one or more processing elements.

The multi-process control system 84 is locally located relative to the workpiece handling system 85, the GCIB processing system 86, and the etching system 88, or it is remotely located relative to the workpiece handling system 85, the GCIB processing system 86, and the etching system 88. For example, multi-process control system 84 is configured to exchange data with the workpiece handling system 85, the GCIB processing system 86, and the etching system 88 using a direct connection, an intranet, and/or the internet. Multi-process control system 84 is coupled to an intranet at, for example, a customer site (i.e., a device maker, etc.), or it is coupled to an intranet at, for example, a vendor site (i.e., an equipment manufacturer). Alternatively or additionally, the multi-process control system 84 is coupled to the internet. In yet another embodiment, another computer (i.e., controller, server, etc.) accesses the multi-process control system 84 to exchange data via a direct connection, an intranet, and/or the internet.

The etching system 88 may include a dry etching system, or a wet etching system, or both. The dry etching system may include a dry non-plasma etching system, or a dry plasma etching system, or both. The wet etching system may include a system configured for immersion of one or more workpieces in a liquid phase etching solution.

A GCIB processing system 100 for performing corrective processing as described above is depicted in FIG. 8 according to an embodiment. The GCIB processing system 100 comprises a vacuum vessel 102, workpiece holder 150, upon which a workpiece 152 to be processed is affixed, and vacuum pumping systems 170A, 170B, and 170C. Workpiece 152 can be a semiconductor substrate, a wafer, a flat panel display (FPD), a liquid crystal display (LCD), or any other workpiece. GCIB processing system 100 is configured to produce a GCIB for treating workpiece 152.

Figure 8:
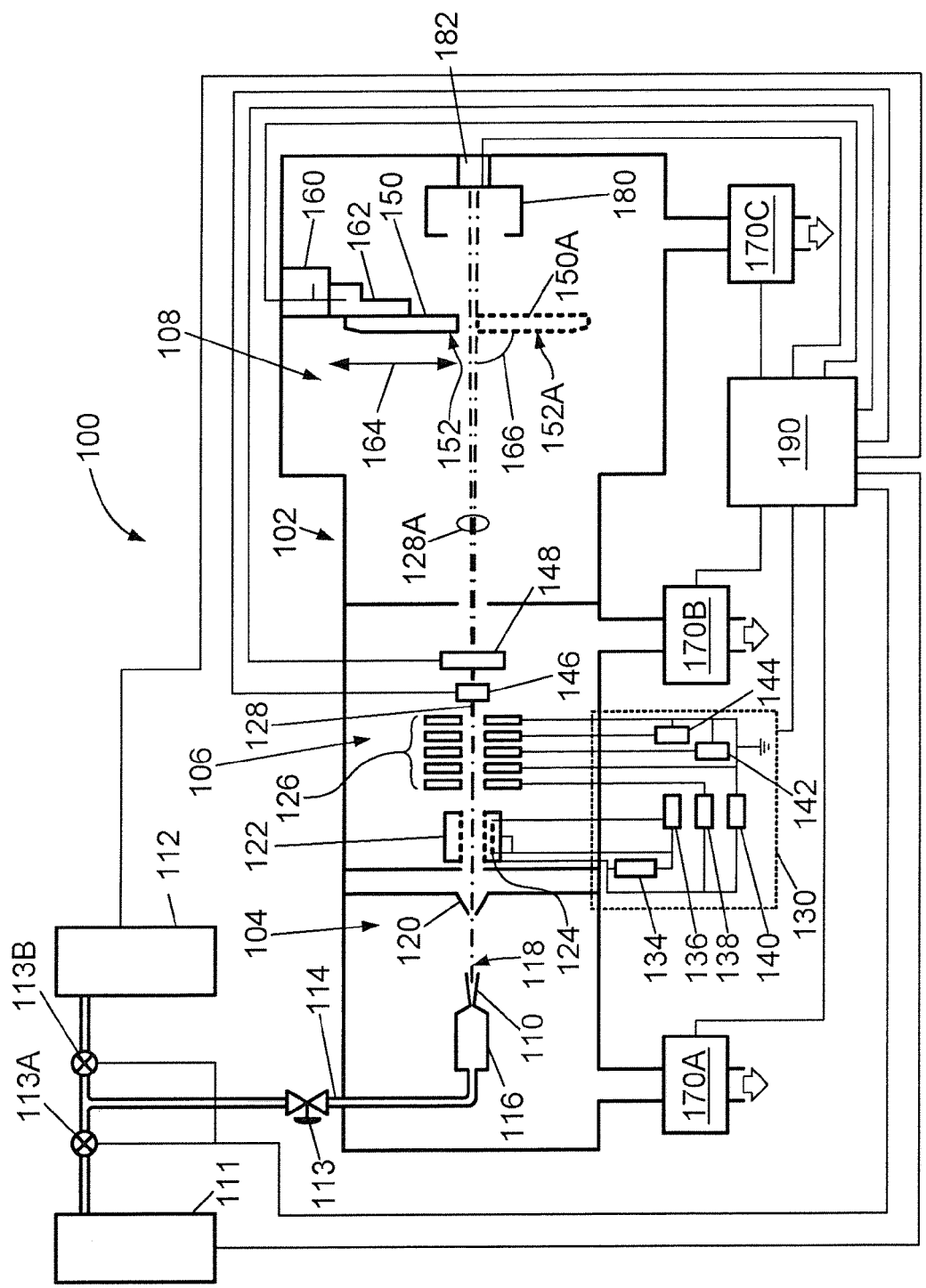
FIG. 8 is an illustration of a GCIB processing system.

Referring still to GCIB processing system 100 in FIG. 8, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a gas cluster ion beam can be formed in the second chamber (ionization/acceleration chamber 106) wherein the gas cluster beam is ionized and accelerated. Then, in the third chamber (processing chamber 108), the accelerated gas cluster ion beam may be utilized to treat workpiece 152.

As shown in FIG. 8, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Furthermore, for example, the first gas composition or the second gas composition or both can comprise a film-forming gas composition. Further yet, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The film-forming composition can comprise a film precursor or precursors that include the principal atomic or molecular species of the film desired to be formed or produced (e.g., deposited or grown) on the workpiece, i.e., the sacrificial material.

When depositing or growing a sacrificial material, the pressurized gas mixture from the first gas source 111 and/or the second gas source 112 may comprise an oxygen-containing gas, a nitrogen-containing gas, a carbon-containing gas, a hydrogen-containing gas, a silicon-containing gas, a germanium-containing gas, or an optional inert gas, or a combination of two or more thereof. For example, when growing an oxide or performing an oxidation process, the pressurized gas mixture may comprise an oxygen-containing gas, such as $O_2$. Additionally or alternatively, for example, the pressurized gas mixture may comprise $O_2$, $N_2$, NO, $NO_2$, $N_2O$, CO, or $CO_2$, or any combination of two or more thereof. Additionally, for example, the optional inert gas may comprise a noble gas.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 8, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 8, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 8, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 8, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A workpiece 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large workpieces with spatially uniform results, a scanning system may be desirable to uniformly scan the process GCIB 128A across large areas to produce spatially homogeneous results.

An X-scan actuator 160 provides linear motion of the workpiece holder 150 in the direction of X-scan motion (into and out of the plane of the paper). A Y-scan actuator 162 provides linear motion of the workpiece holder 150 in the direction of Y-scan motion 164, which is typically orthogonal to the X-scan motion. The combination of X-scanning and Y-scanning motions translates the workpiece 152, held by the workpiece holder 150, in a raster-like scanning motion through process GCIB 128A to cause a uniform (or otherwise programmed) irradiation of a surface of the workpiece 152 by the process GCIB 128A for processing of the workpiece 152.

The workpiece holder 150 disposes the workpiece 152 at an angle with respect to the axis of the process GCIB 128A so that the process GCIB 128A has an angle of beam incidence 166 with respect to a surface of workpiece 152. The angle of beam incidence 166 may be 90 degrees or some other angle, but is typically 90 degrees or near 90 degrees. During Y-scanning, the workpiece 152 and the workpiece holder 150 move from the shown position to the alternate position "A" indicated by the designators 152A and 150A, respectively. Notice that in moving between the two positions, the workpiece 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the workpiece holder 150 in the path of the process GCIB 128A so as to intercept a sample of the process GCIB 128A when the workpiece holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 8, control system 190 connects to the X-scan actuator 160 and the Y-scan actuator 162 through electrical cable and controls the X-scan actuator 160 and the Y-scan actuator 162 in order to place the workpiece 152 into or out of the process GCIB 128A and to scan the workpiece 152 uniformly relative to the process GCIB 128A to achieve desired processing of the workpiece 152 by the process GCIB 128A. Control system 190 receives the sampled beam current collected by the beam current sensor 180 by way of an electrical cable and, thereby, monitors the GCIB and controls the GCIB dose received by the workpiece 152 by removing the workpiece 152 from the process GCIB 128A when a predetermined dose has been delivered.

Figure 9:
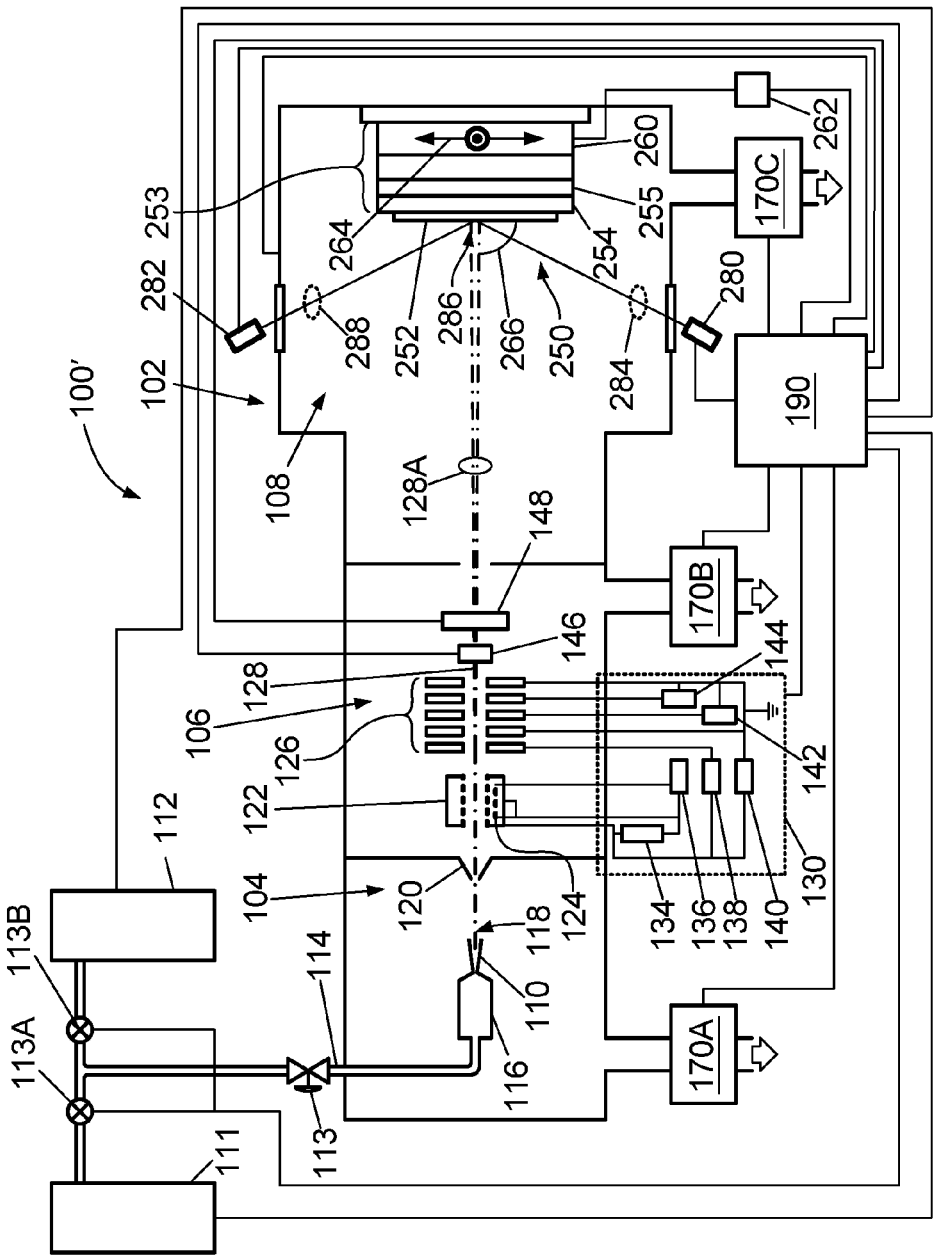
FIG. 9 is another illustration of a GCIB processing system.

In the embodiment shown in FIG. 9, the GCIB processing system 100' can be similar to the embodiment of FIG. 8 and further comprise a X-Y positioning table 253 operable to hold and move a workpiece 252 in two axes, effectively scanning the workpiece 252 relative to the process GCIB 128A. For example, the X-motion can include motion into and out of the plane of the paper, and the Y-motion can include motion along direction 264.

The process GCIB 128A impacts the workpiece 252 at a projected impact region 286 on a surface of the workpiece 252, and at an angle of beam incidence 266 with respect to the surface of workpiece 252. By X-Y motion, the X-Y positioning table 253 can position each portion of a surface of the workpiece 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the workpiece 252 within the projected impact region 286. In one embodiment, X-Y positioning table 253 is programmably operable by the control system 190 to scan, with programmable velocity, any portion of the workpiece 252 through the projected impact region 286 for GCIB processing by the process GCIB 128A.

The workpiece holding surface 254 of positioning table 253 is electrically conductive and is connected to a dosimetry processor operated by control system 190. An electrically insulating layer 255 of positioning table 253 isolates the workpiece 252 and workpiece holding surface 254 from the base portion 260 of the positioning table 253. Electrical charge induced in the workpiece 252 by the impinging process GCIB 128A is conducted through workpiece 252 and workpiece holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 8) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the workpiece 252 with the process GCIB 128A. The control system 190 monitors measurements of the GCIB current collected by the workpiece 252 in order to compute the accumulated dose received by the workpiece 252. When the dose received by the workpiece 252 reaches a predetermined dose, the control system 190 closes the beam gate 148 and processing of the workpiece 252 is complete. Based upon measurements of the GCIB dose received for a given area of the workpiece 252, the control system 190 can adjust the scan velocity in order to achieve an appropriate beam dwell time to treat different regions of the workpiece 252.

Alternatively, the process GCIB 128A may be scanned at a constant velocity in a fixed pattern across the surface of the workpiece 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate workpiece 252 with an incident optical signal 284 and to receive a scattered optical signal 288 from workpiece 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a workpiece, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the workpiece 252.

Figure 10:
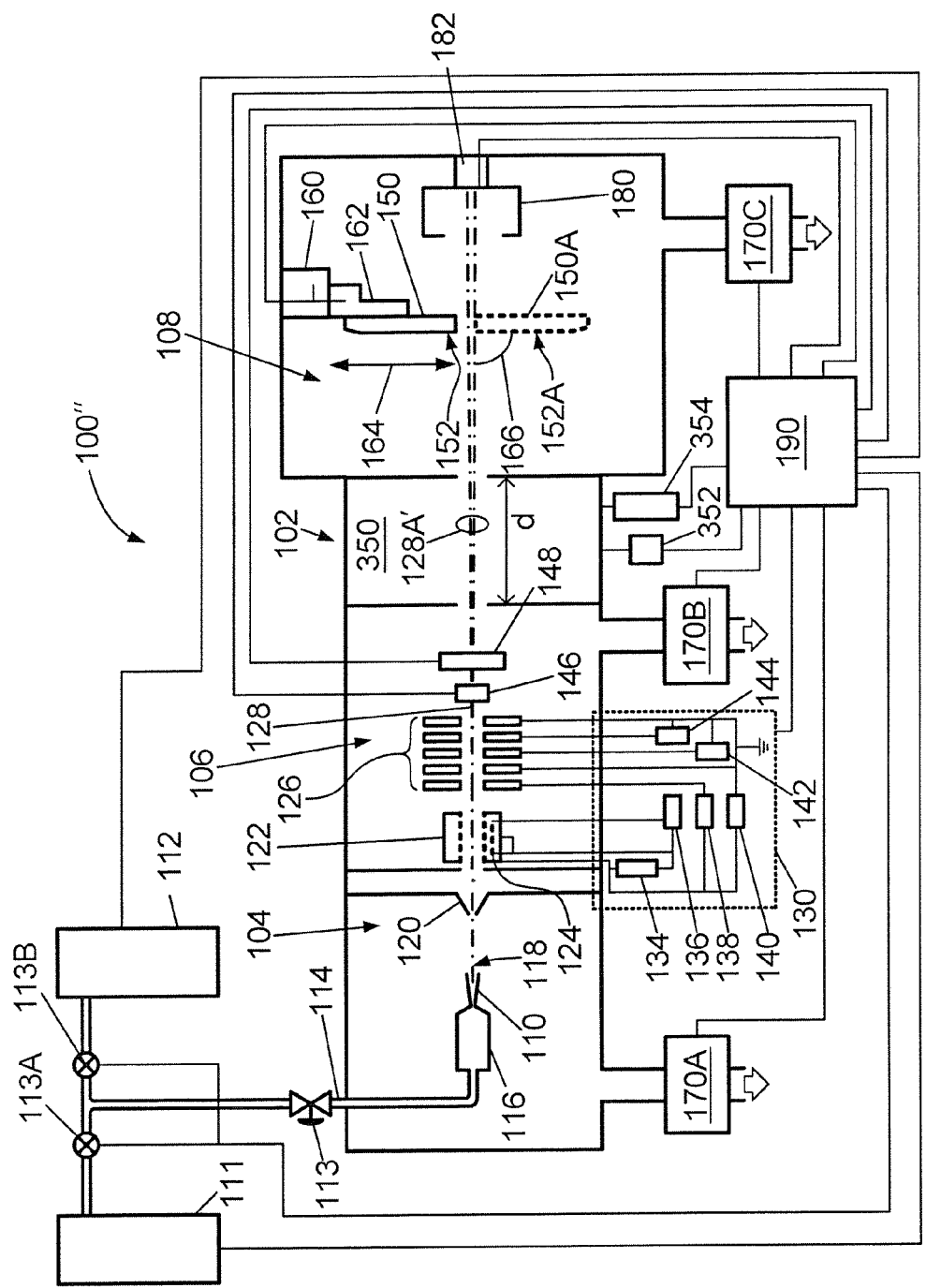
FIG. 10 is yet another illustration of a GCIB processing system.

In the embodiment shown in FIG. 10, the GCIB processing system 100" can be similar to the embodiment of FIG. 8 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configure to measure the elevated pressure in the pressure cell chamber 350.

The pressure cell chamber 350 may be configured to modify the beam energy distribution of GCIB 128 to produce a modified process GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "METHOD AND APPARATUS FOR IMPROVED PROCESSING WITH A GAS-CLUSTER ION BEAM"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100") a as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on workpiece 152 (or 252).

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Workpiece 152 (or 252) can be affixed to the workpiece holder 150 (or substrate holder 250) via a clamping system (not shown), such as a mechanical clamping system or an electrical clamping system (e.g., an electrostatic clamping system). Furthermore, workpiece holder 150 (or 250) can include a heating system (not shown) or a cooling system (not shown) that is configured to adjust and/or control the temperature of workpiece holder 150 (or 250) and workpiece 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104,106,108. The pressure-measuring device can be, for example, a capacitance manometer or ionization gauge.

Figure 11:
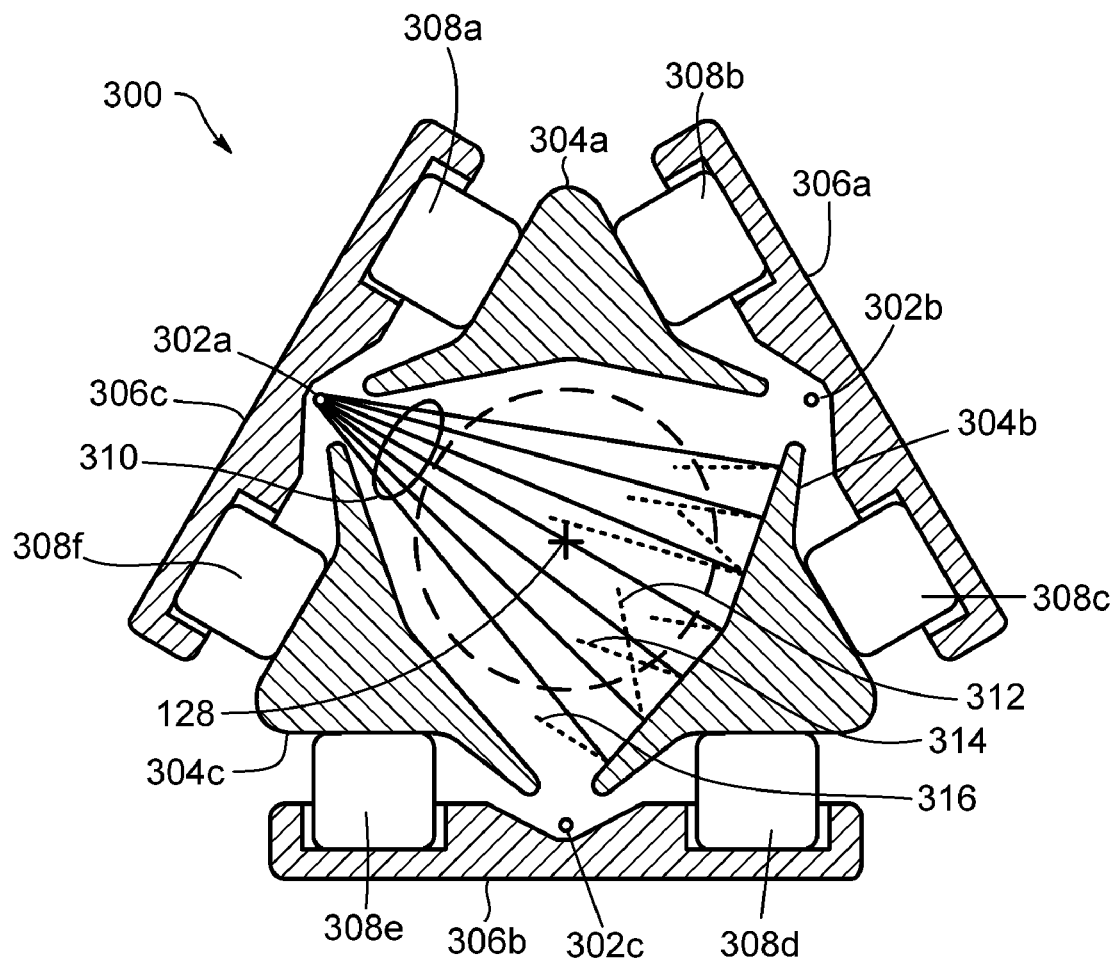
FIG. 11 is an illustration of an ionization source for a GCIB processing system.

Referring now to FIG. 11, a section 300 of a gas cluster ionizer (122, FIGS. 8, 9 and 10) for ionizing a gas cluster jet (gas cluster beam 118, FIGS. 8, 9 and 10) is shown. The section 300 is normal to the axis of GCIB 128. For typical gas cluster sizes (2000 to 15000 atoms), clusters leaving the skimmer aperture (120, FIGS. 8, 9 and 10) and entering an ionizer (122, FIGS. 8, 9 and 10) will travel with a kinetic energy of about 130 to 1000 electron volts (eV). At these low energies, any departure from space charge neutrality within the ionizer 122 will result in a rapid dispersion of the jet with a significant loss of beam current. FIG. 11 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled "IONIZER AND METHOD FOR GAS-CLUSTER ION-BEAM FORMATION"; the content of which is incorporated herein by reference in its entirety.

The gas cluster ionizer (122, FIGS. 8, 9 and 10) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of performing corrective processing of a surface on a workpiece, comprising:
   preparing correction data for a workpiece, said correction data being computed from metrology data that is related to a surface profile of a surface on said workpiece;
   selectively forming a sacrificial material on one or more regions of a surface on said workpiece using a gas cluster ion beam (GCIB), wherein an amount of said sacrificial material formed on said one or more regions of said surface by said GCIB is determined according to said correction data; and
   adjusting a surface profile of said surface on said workpiece by performing an etching process following said selective formation, wherein said etching process comprises etching said sacrificial material at a first etch rate, and etching said workpiece at a second etch rate.

2. The method of claim 1, wherein said sacrificial material has a different composition than the material composition of said workpiece.

3. The method of claim 1, wherein said first etch rate is different than said second etch rate.

4. The method of claim 3, wherein said second etch rate is greater than said first etch rate.

5. The method of claim 1, wherein said surface of said workpiece comprises an initial surface profile prior to said selective formation having a maximum surface height and a minimum surface height.

6. The method of claim 5, wherein said sacrificial material is deposited to a height intermediate to said maximum surface height of said initial surface profile and said minimum surface height of said initial surface profile.

7. The method of claim 6, wherein said second etch rate is greater than said first etch rate, and wherein said adjusting etches said workpiece material to at least said minimum surface height of said initial surface profile.

8. The method of claim 5, wherein said surface of said workpiece comprises a final surface profile following said adjusting, and wherein a first difference between a maximum surface height of said final surface profile and a minimum surface height of said final surface profile is less than a second difference between said maximum surface height of said initial surface profile and said minimum surface height of said initial surface profile.

9. The method of claim 5, wherein said sacrificial material is deposited to a height equal to or greater than said maximum surface height of said initial surface profile.

10. The method of claim 9, wherein the first etch rate and the second etch rate are approximately equal.

11. The method of claim 1, wherein said adjusting said surface profile of said surface comprises substantially planarizing said surface of said workpiece.

12. A method of performing corrective processing on a workpiece, comprising:
   acquiring metrology data related to a surface profile of a surface on a workpiece;
   computing correction data for said workpiece using said metrology data;
   applying said correction data to said workpiece using a gas cluster ion beam (GCIB) to selectively form a sacrificial material on one or more regions of a surface on said workpiece; and
   performing an etching process to remove said sacrificial material and at least a portion of said surface on said workpiece.

13. The method of claim 12, wherein said metrology data is measured at a plurality of locations on said workpiece.

14. The method of claim 13, wherein said applying said correction data for said workpiece comprises using said GCIB and varying a beam dose, a beam area, a beam profile, a beam intensity, a beam scanning rate, or an exposure time, or any combination of two or more thereof.

15. The method of claim 12, wherein said etching process etches said sacrificial material at a first etch rate, and wherein said etching process etches said portion of said surface on said workpiece at a second etch rate different than said first etch rate.

16. The method of claim 15, wherein said second etch rate is greater than said first etch rate, and wherein said performing said etching process planarizes said surface on said workpiece.

17. A method of performing corrective processing of a surface profile on a workpiece, comprising:
identifying a minimum surface height for one or more first regions and a maximum surface height for one or more second regions of an initial uneven surface profile to establish an initial value of a height differential;
preparing correction data for a workpiece, said correction data being computed from metrology data that is related to the surface profile of a surface on said workpiece;
selectively forming a sacrificial material on said one or more first regions of said workpiece using a gas cluster ion beam (GCIB) to effectively increase said minimum surface height and decrease said height differential from said initial value, wherein an amount of said sacrificial material formed on said one or more regions of said surface by said GCIB is determined according to said correction data; and
adjusting the surface profile of said workpiece to a target surface profile having a target value for said height differential that is less than said initial value by performing an etching process following said selective formation, wherein said etching process comprises etching said sacrificial material at a first etch rate, and etching said workpiece at a second etch rate.

18. The method of claim 17, wherein said sacrificial material is selectively formed on said one or more first regions to a height intermediate to said maximum surface height and said minimum surface height of said initial uneven surface profile, and wherein said second etch rate is greater than said first etch rate, and wherein said adjusting etches said workpiece to at least said minimum surface height of said initial uneven surface profile.

19. The method of claim 17, wherein said sacrificial material is selectively formed on said one or more first regions to a height equal to or greater than said maximum surface height of said initial uneven surface profile, and wherein the first etch rate and the second etch rate are approximately equal.

20. The method of claim 17, wherein said target surface profile is planar with said target value being essentially zero for said height differential and said adjusting etches said workpiece to at least said minimum surface height of said initial uneven surface profile to reach said target value of zero.

\* \* \* \* \*